US007489515B2

(12) United States Patent  (10) Patent No.: US 7,489,515 B2
Huang                      (45) Date of Patent:     Feb. 10, 2009

(54) EXPANSION CARD

(75) Inventor: Chi-Jung Huang, Jhonghe (TW)

(73) Assignee: Broadtek Technology Co., Ltd., Taipei Hsien (TW)

( * ) Notice: Subject to any disclaimer, the term of this patent is extended or adjusted under 35 U.S.C. 154(b) by 190 days.

(21) Appl. No.: 11/590,722

(22) Filed: Oct. 31, 2006

(65) Prior Publication Data

US 2008/0101042 A1 May 1, 2008

(51) Int. Cl.
H05K 5/02 (2006.01)
(52) U.S. Cl. .............. 361/737; 361/752; 361/740; 361/747; 361/759; 439/946; 439/76.1; 235/492; 235/487
(58) Field of Classification Search ........ 361/737, 361/740, 747, 759, 752, 732; 439/76.1, 946, 439/945; 235/441, 487, 492
See application file for complete search history.

(56) References Cited

U.S. PATENT DOCUMENTS

| 5,038,250 | A | * | 8/1991 | Uenaka et al. | 361/737 |
| 5,339,222 | A | * | 8/1994 | Simmons et al. | 361/818 |
| 5,493,477 | A | * | 2/1996 | Hirai | 361/737 |
| 5,505,628 | A | * | 4/1996 | Ramey et al. | 439/76.1 |
| 5,536,905 | A | * | 7/1996 | Redman et al. | 174/372 |
| 5,546,278 | A | * | 8/1996 | Bethurum | 361/737 |
| 5,547,397 | A | * | 8/1996 | Hirai | 439/607 |
| 5,548,483 | A | * | 8/1996 | Feldman | 361/737 |
| 5,548,485 | A | * | 8/1996 | Bethurum et al. | 361/737 |
| 5,572,408 | A | * | 11/1996 | Anhalt et al. | 361/737 |
| 5,673,181 | A | * | 9/1997 | Hsu | 361/760 |
| 5,846,092 | A | * | 12/1998 | Feldman et al. | 439/76.1 |
| 6,018,190 | A | * | 1/2000 | Wang et al. | 257/679 |
| 6,058,018 | A | * | 5/2000 | Gerrits et al. | 361/737 |
| 6,181,564 | B1 | * | 1/2001 | Furusho | 361/737 |
| 6,191,950 | B1 | * | 2/2001 | Cox et al. | 361/737 |
| 6,291,950 | B1 | * | 9/2001 | Jeong | 318/400.01 |
| 6,324,076 | B1 | * | 11/2001 | Gerrits et al. | 361/818 |
| 6,337,797 | B1 | * | 1/2002 | Huang | 361/737 |
| 6,353,534 | B1 | * | 3/2002 | Chen | 361/684 |
| 6,527,188 | B1 | * | 3/2003 | Shobara et al. | 235/486 |
| 6,533,177 | B1 | * | 3/2003 | Gerrits et al. | 235/487 |
| 6,877,995 | B1 | * | 4/2005 | Chen | 439/76.1 |
| 7,075,792 | B2 | * | 7/2006 | Tseng et al. | 361/737 |
| 7,108,518 | B2 | * | 9/2006 | Tseng | 439/76.1 |
| 2004/0252466 | A1 | * | 12/2004 | Bor-Ren | 361/737 |

* cited by examiner

Primary Examiner—Dameon E Levi
(74) Attorney, Agent, or Firm—William E. Pelton, Esq.; Cooper & Dunham LLP

(57) ABSTRACT

An expansion card has a terminal block, a top metal sheet, bottom metal sheet and a plastic seat. Two step retainers are formed respectively on two short edges of the terminal block. Two pairs of hooks are formed on the two long edges adjacent respectively to front and rear ends of the bottom metal sheet. The hooks of one pair hook respectively on the step retainers. The two long edges of the top metal sheet both extend to form Two bent portions are formed respectively on the long edges of the bottom metal sheet. The plastic seat is engaged with the top and bottom metal sheet. Fabrication of the expansion card is easy and convenient.

4 Claims, 6 Drawing Sheets

EXPANSION CARD

BACKGROUND OF THE INVENTION

1. Field of the Invention

The present invention relates to a kind of computer accessories, and particularly relates to an expansion card that is fabricated easily and conveniently.

2. Description of the Related Art

Computers play an important part in people's daily life today, and a computer system comprises not only a motherboard, but also one or more expansion cards that provide specialized functions.

The expansion cards are classified into many sorts such as network cards or memory cards, which can be mounted on the computer. However, an expansion card normally has lots of mounting elements so the fabrication of the expansion card is complicated and time-consuming, which raises the mounting cost.

Therefore, the invention provides an expansion card that to mitigate or obviate the aforementioned problems.

SUMMARY OF THE INVENTION

The main objective of the present invention is to provide an expansion card that is fabricated easily and conveniently.

An expansion card has a terminal block, a top metal sheet, bottom metal sheet and a plastic seat. Two step retainers are formed respectively on two short edges of the terminal block. Two pairs of hooks are formed on the two long edges adjacent respectively to front and rear ends of the bottom metal sheet. The hooks of one pair hook respectively on the step retainers. The two long edges of the top metal sheet both extend to form Two bent portions are formed respectively on the long edges of the bottom metal sheet. The plastic seat is engaged with the top and bottom metal sheet.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
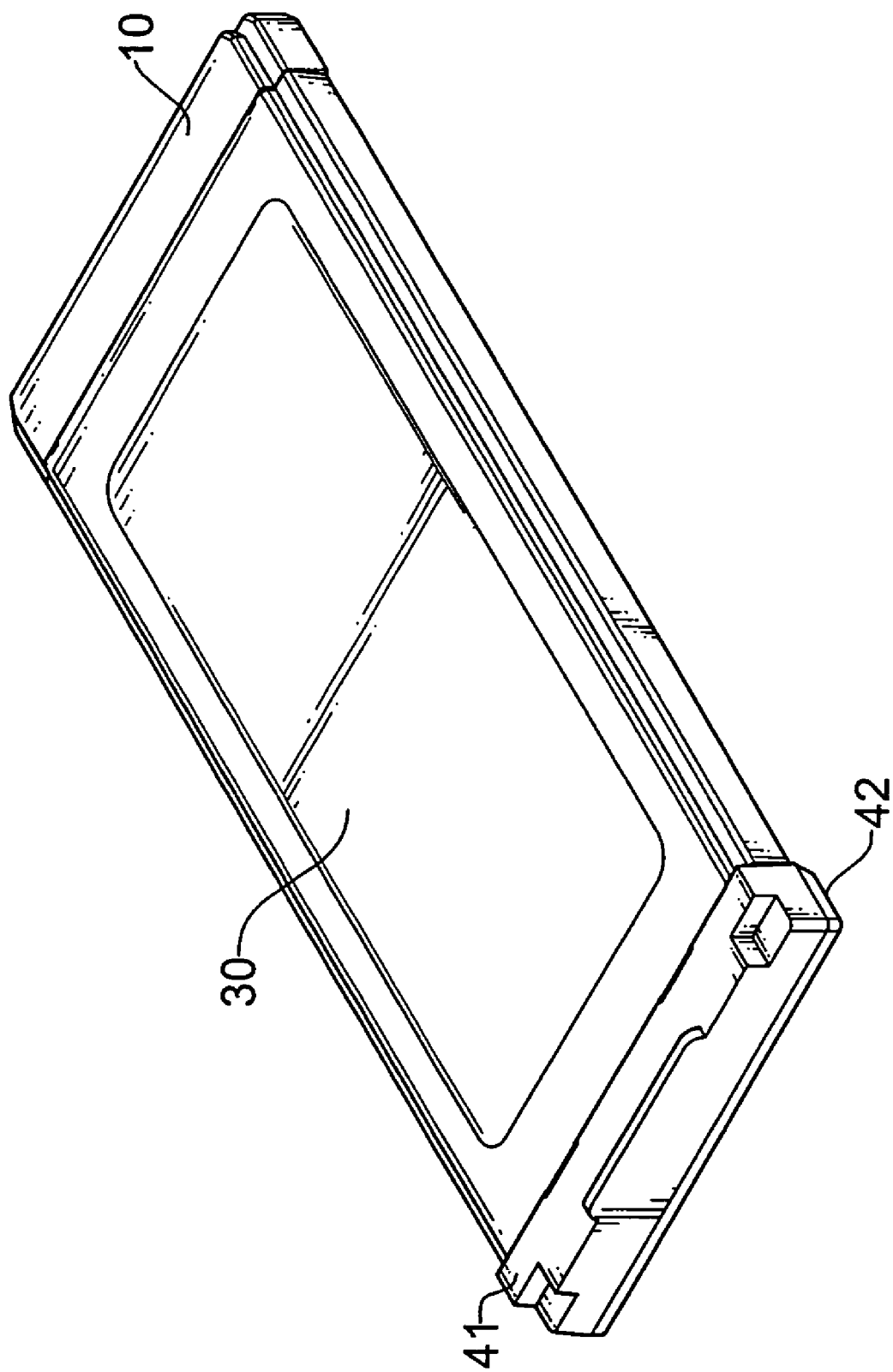
FIG. 1 is a perspective view of an expansion card in accordance with this invention.
Figure 2:
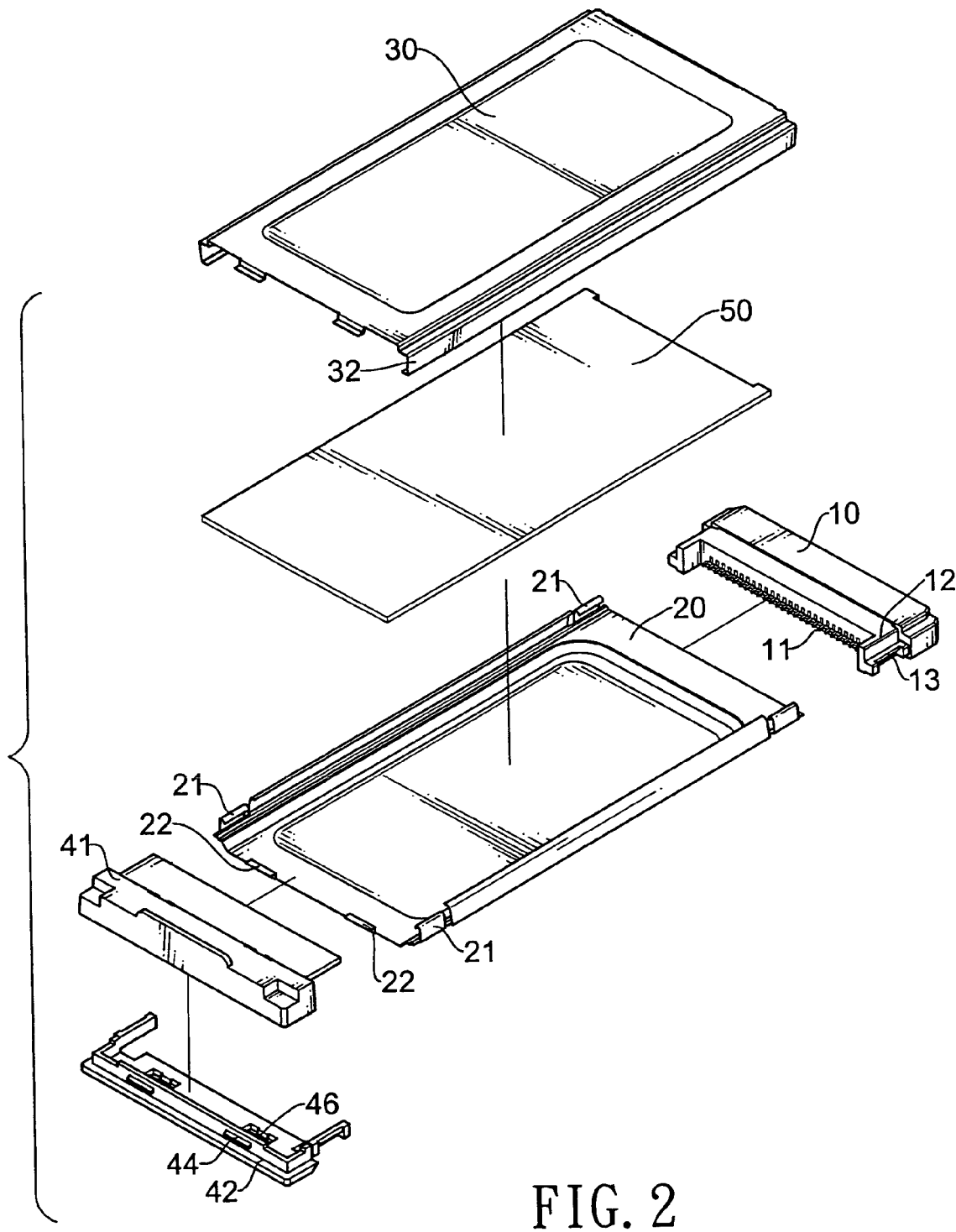
FIG. 2 is an exploded perspective view of the expansion card in FIG. 1.

With reference to FIGS. 1-2, an expansion card in accordance with present invention has a terminal block (10), a bottom metal sheet (20), a top metal sheet (30), a plastic seat, and a printed circuit board (PCB) (50). The PCB (50) relates to a conventional technique, so its description is omitted.

The terminal block (10) is rectangular and has a top, a bottom, two long edges and two short edges and includes multiple terminals (11), two notches (12) and two stepped retainers (13). The terminals (11) are arranged abreast and are mounted on one of the long edges. The notches (12) are defined respectively in the two short edges. The stepped retainers (13) are formed respectively on the two short edges.

The bottom metal sheet (20) is rectangular and has two long edges, two short edges, a front end, a rear end, a front pair of hooks (21), a rear pair of hooks (21) and two first connection members (22). The rear end of the bottom metal sheet (20) is mounted at the bottom of the terminal block (10). The hooks (21) of the front pair are formed respectively on the long edges of the bottom metal sheet (20) adjacent to the front end. The hooks (21) of the rear pair are formed respectively on the two long edges of the bottom metal sheet (20) adjacent to the rear end and hook respectively on the step retainers (13). The first connection members (22) extend upward from the front end of the bottom metal sheet (20).

Figure 3:
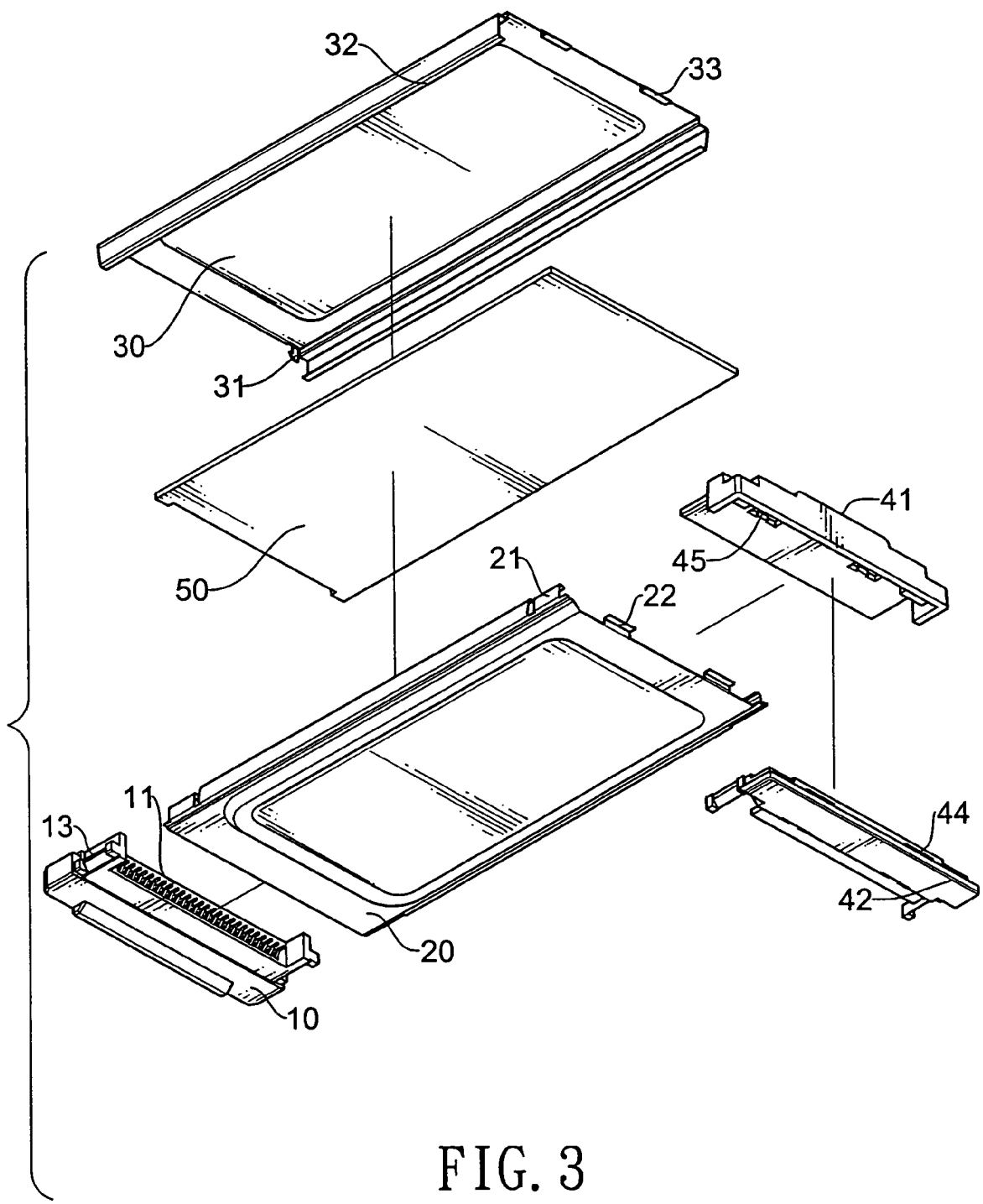
FIG. 3 is another exploded perspective view of the expansion card in FIG. 1.
Figure 4:
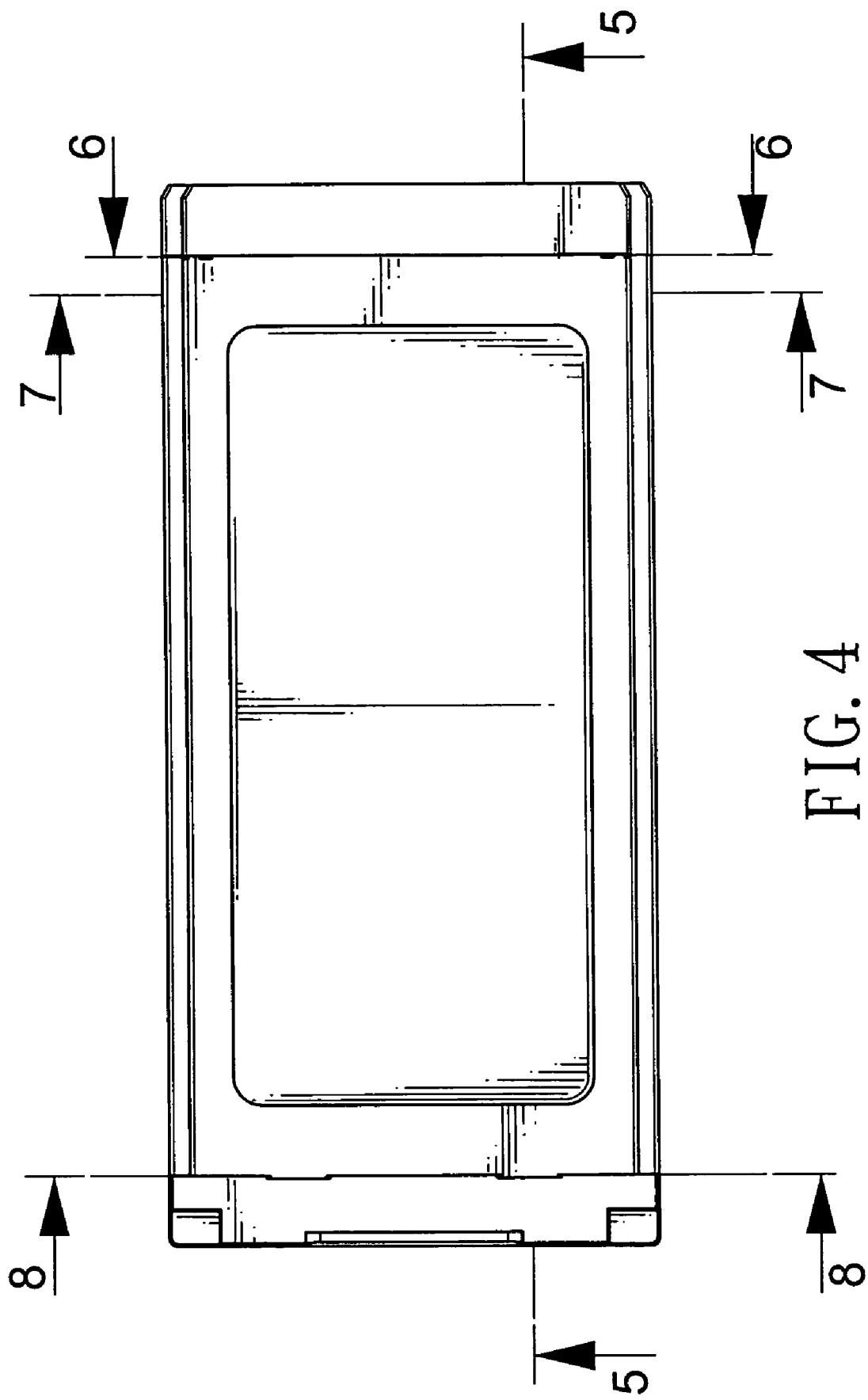
FIG. 4 is a top view of the expansion card in FIG. 1.

With further reference to FIG. 3, the top metal sheet (30) is rectangular and has a front end, a rear end, two long edges, two short edges, two barbs (31), two bent portions (32) and two second connection members (33). The rear end of the top metal sheet (30) is mounted at the top of the terminal block (10). A barb (31) is formed in one short edge in the rear end. The barbs (31) are formed on one short edge of the top metal sheet (30), protrude down and hook respectively into the notches (12) of the terminal block (10). The bent portions (32) are L-shaped, are formed respectively on and protrudes respectively from the long edges of the top metal sheet (30) and respectively abut the long edges of the bottom metal sheet (20). The second connection members (33) extend downward from the front end of the top metal sheet (30) and correspond respectively to the first connection members (22).

Figure 5:
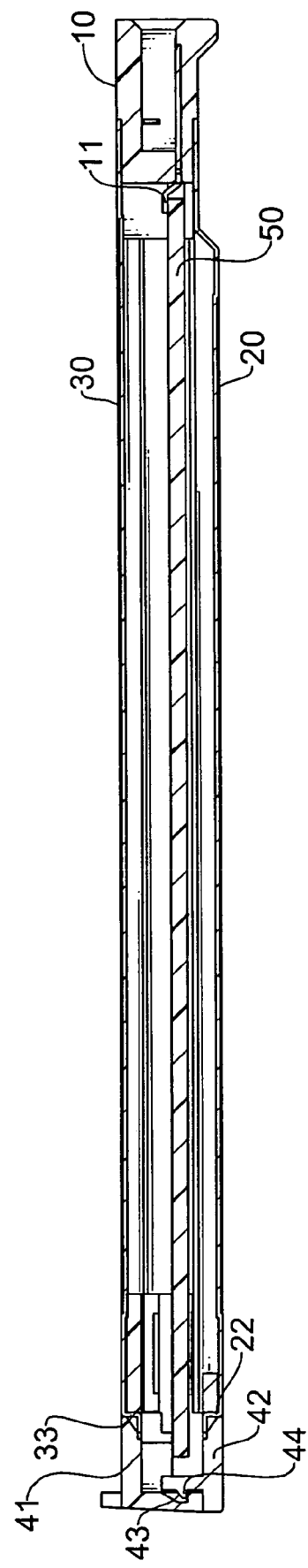
FIG. 5 is a cross sectional side view of the expansion card along line 5-5 in FIG. 4.

With further reference to FIG. 5, the plastic seat is rectangular, and includes an opening, a top seat half (41) and a bottom seat half (42). The opening is defined in the plastic seat and is engaged with the bottom and the top metal sheets (20, 30) opposite to the terminal block (10). The top seat half (41) has a mounting tab and two slots (43). The mounting tab is formed on and protrudes perpendicularly from the top seat half (41). The slots (43) are defined in the mounting tab of the top seat half (41). The bottom seat half (42) is mounted to the top seat half (41) and has a mounting tab and two lugs (44). The mounting tab is formed on and protrudes perpendicularly from the bottom seat half (42). The lugs (44) are formed on the mounting tab of the bottom seat half (42) and are engaged respectively with the slots (43) to mount the top seat half (41) on the bottom seat half (42). In addition, each of the top seat half (41) and the bottom seat half (42) has two joint elements. The joint elements of the top seat half (41) may be upper slots (45) and are engaged respectively with the second connection members (33). The joint elements of the bottom seat half (42) may be lower slots (46) and are engaged respectively with the first connection members (22).

The PCB (50) is mounted between the top metal sheet (30) and the bottom metal sheet (20).

With reference to FIG. 4, and FIGS. 6-8, fabrication steps of the expansion card are as follows.

Figure 6:
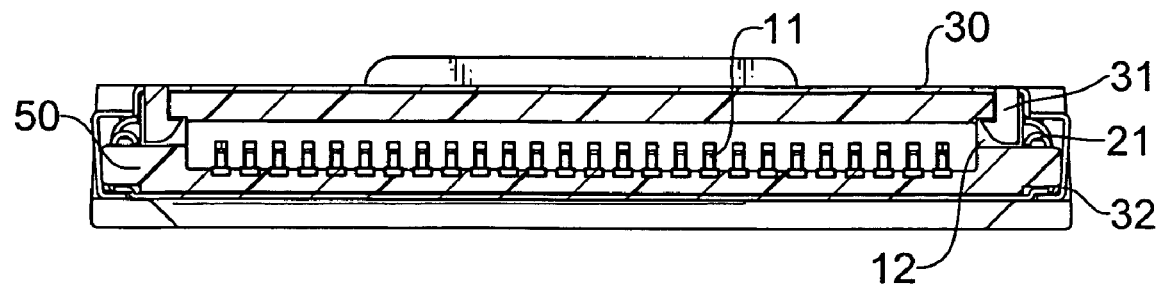
FIG. 6 is a cross sectional rear view of the expansion card along line 6-6 in FIG. 4.
Figure 7:
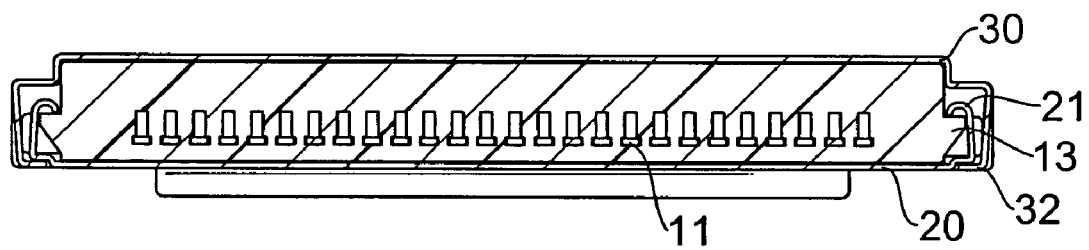
FIG. 7 is a cross sectional front view of the expansion card along line 7-7 in FIG. 4.
Figure 8:
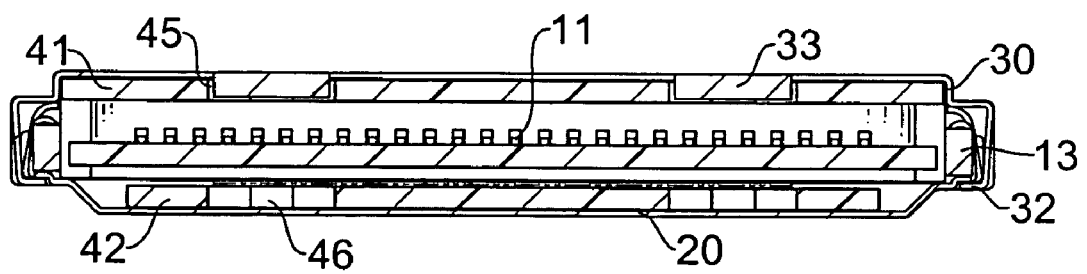
FIG. 8 is a cross sectional front view of the expansion card along line 8-8 in FIG. 4.

The barb (31) is inserted into the notch (12) in the terminal blocks (10), as shown in FIG. 6. The bottom metal sheet (20) slides into the top metal sheet (30). The hooks (21) hook respectively on the step retainers (13), as shown in FIG. 7. Then the upper slots (45) and lower slots (46) respectively accommodate the first and second connection members (22, 33) to securely mount the top (41) seat half and the bottom seat half (42) respectively on the top and bottom metal sheets (30, 20), as shown in FIG. 8. The fabrication steps are easy and convenient, which further lowers the manufacturing cost of the expansion card.

It is to be understood, however, that even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An expansion card comprising:
    a terminal block being rectangular, having a top, a bottom, two long edges, two short edges, multiple terminal arranged abreast in one of the long edges of the terminal block, two stepped retainers formed respectively on the short edges of the terminal block;
    a bottom metal sheet being rectangular and having two long edges, two short edges, a front end, a rear end mounted at the bottom of the terminal block, a front pair of hooks formed respectively on the long edges of the bottom metal sheet adjacent to the front end, a rear pair of hooks formed respectively on the long edges adjacent to the rear end and hooking respectively on the stepped retainers, and two first connection members extending upward from the front end of the bottom metal sheet;
    a top metal sheet being rectangular and having a front end, a rear end mounted on the top of the terminal block, two long edges, two bent portions being L-shaped, formed respectively on and protruding respectively from the long edges of the top metal sheet and respectively abutting the long edges of the bottom metal sheet, and two second connection members extending downward from the front end of the top metal sheet and corresponding respectively to the first connection members;
    a plastic seat being rectangular and having an opening defined in the plastic seat, engaged with the bottom and the top metal sheets and having four joint elements engaged respectively with the first and second connection members on the top and bottom metal sheet.

2. The expansion card as claimed in claim 1, wherein two notches are respectively defined in the two short edges of the terminal block, two barbs are formed on one short edge of the top metal sheet, protrude downward and hook respectively into the notches of the terminal block.

3. The expansion card as claimed in claim 1, wherein the joint elements are two upper slots engaging respectively with the first connection members and two lower slots engaging respectively with the second connection members.

4. The expansion card as claimed in claim 3, wherein the plastic seat includes
    a top seat half having a mounting tab formed on and protruding from the top seat half and two slots defined in the mounting tab of the top seat half; and
    a bottom seat half mounted to the top seat half and having a mounting tab formed on and protruding from the bottom seat half and two lugs formed on the mounting tab of the bottom seat half and engaged respectively with the slots.

* * * * *